(12) United States Patent
Hwang et al.

(10) Patent No.: US 8,166,647 B2
(45) Date of Patent: May 1, 2012

(54) METHOD OF MANUFACTURING A PRINTED CIRCUIT BOARD

(75) Inventors: Jun-Oh Hwang, Busan (KR); Jee-Soo Mok, Yongin-si (KR); Jun-Heyoung Park, Hwaseong-si (KR); Kyung-Ah Lee, Seoul (KR); Eung-Suek Lee, Ansan-si (KR)

(73) Assignee: Samsung Electro-Mechanics Co., Ltd. (KR)

( * ) Notice: Subject to any disclaimer, the term of this patent is extended or adjusted under 35 U.S.C. 154(b) by 596 days.

(21) Appl. No.: 12/352,090

(22) Filed: Jan. 12, 2009

(65) Prior Publication Data

US 2009/0321109 A1   Dec. 31, 2009

(30) Foreign Application Priority Data

Jun. 26, 2008   (KR) .................. 10-2008-0060965

(51) Int. Cl.
*H05K 3/02* (2006.01)

(52) U.S. Cl. ............... 29/846; 29/830; 29/831; 29/832; 29/852; 29/848

(58) Field of Classification Search ............ 29/852, 29/832, 831, 846, 847, 848, 849; 174/250, 174/254, 259; 361/627, 633, 651, 719, 720; 977/742, 842, 845, 876

See application file for complete search history.

(56) References Cited

U.S. PATENT DOCUMENTS

| 5,526,564 | A  | * | 6/1996 | Ohshima et al. | 29/852 |
| 5,746,868 | A  | * | 5/1998 | Abe | 156/247 |
| 7,672,547 | B2 | * | 3/2010 | Kim et al. | 385/14 |

FOREIGN PATENT DOCUMENTS

| JP | 07-142819 | 6/1995 |
| JP | 2003-204140 | 7/2003 |
| KR | 10 0787089 B1 | 12/2007 |

OTHER PUBLICATIONS

Korean Office Action issued in Korean Patent Application No. 10-2008-0060965 dated Feb. 22, 2010.

* cited by examiner

*Primary Examiner* — Derris Banks
*Assistant Examiner* — Tai Nguyen
(74) *Attorney, Agent, or Firm* — McDermott Will & Emery LLP

(57) ABSTRACT

A printed circuit board and a method for manufacturing the printed circuit board are disclosed. The method can include; providing an insulated layer, in which a first metal layer is formed on one side of the insulated layer; forming a groove on the insulated layer; forming a metallic substance on an inner side of the groove and on another side of the insulated layer; and forming a first circuit pattern on at least one of one side of the insulated layer and the metallic substance formed on the groove by removing a portion of the first metal layer. The present invention provides the printed circuit board having a high efficiency of heat emission by disposing a heat sink in direct contact with a board and the method of manufacturing the printed circuit board.

6 Claims, 14 Drawing Sheets

METHOD OF MANUFACTURING A PRINTED CIRCUIT BOARD

CROSS-REFERENCE TO RELATED APPLICATIONS

This application claims the benefit of Korean Patent Application No. 10-2008-0060965 filed with the Korean Intellectual Property Office on Jun. 26, 2008, the disclosure of which is incorporated herein by reference in its entirety.

BACKGROUND

1. Technical Field

The present invention relates to a printed circuit board and a method of manufacturing the printed circuit board.

2. Description of the Related Art

Recently, the demands have increased for a printed circuit board being loaded with a number of passive components and multi-layered high density packages, spurred by trends towards providing electronic equipments in thinner and smaller shape.

A printed circuit board may connect or support electronic devices according to a type of circuit deigns desired by a designer. As passive components and packages loaded on the printed circuit board are increasing, there will be more heat generated, and electricity will be consumed more. Thus, a quality of a printed circuit board may decrease. Therefore, there is a great demand for manufacturing of functional printed circuit boards being able to transfer heat to air flowing through heat sinks.

According to the related art, methods of attachment for heat sinks to a printed circuit board, such as prepreg, electrical conductive adhesives and nonconductive resins, are used to connect metal heat sinks to heat releasing devices.

However, a basic component of materials used for attachment mentioned above is mainly made of polymers, so that the heat transfer to the heat sinks may not be efficient enough.

SUMMARY

The invention provides a printed circuit board having a high efficiency of heat emission and a method of manufacturing the printed circuit board.

An aspect of the invention provides a method of manufacturing a printed circuit board. The method can include providing an insulated layer, in which a first metal layer is formed on one side of the insulated layer, forming a groove on the insulated layer, forming a metallic substance on an inner side of the groove and on another side of the insulated layer, and forming a first circuit pattern on at least one of one side of the insulated layer and the metallic substance formed on the groove by removing a portion of the first metal layer.

As presented above, the groove is formed on the insulated layer by way of a imprint process.

The forming of the metallic substance can comprise printing a metal paste on an inner side of the groove and another side of the insulated layer and sintering the metal paste.

And then, the first metal layer can be treated by way of flash etching prior to the forming of the first circuit pattern.

The metallic substance can be carbon-nanotube. Meanwhile, the method of manufacturing the printed circuit board can further comprise forming a conductive bump on a portion of the first circuit pattern stacking an insulating material on the first circuit pattern such that the first circuit pattern is filled by the insulating material and the insulating material is penetrated by the conductive bump, stacking a second metal layer on the insulating material, and forming a second circuit pattern on the insulating material by removing a portion of the second metal layer.

Another aspect of the invention provides a printed circuit board comprising an insulated layer with a groove formed thereon, a metallic substance formed on an inner side of the groove and on one side of the insulated layer and a first circuit pattern formed on at least one of another side of the insulated layer and the metallic substance formed on the groove.

Again, the described metallic substance can be carbon-nanotube.

Also, the printed circuit board above can further comprise a conductive bump formed on a portion of the first circuit pattern, an insulating material stacked on the first circuit pattern such that the first circuit pattern is filled by the insulating material and the insulating material is penetrated by the conductive bump, and a second circuit pattern formed on the insulating material.

Additional aspects and advantages of the present invention will be set forth in part in the description which follows, and in part will be obvious from the description, or may be learned by practice of the invention.

DETAILED DESCRIPTION

Figure 1:
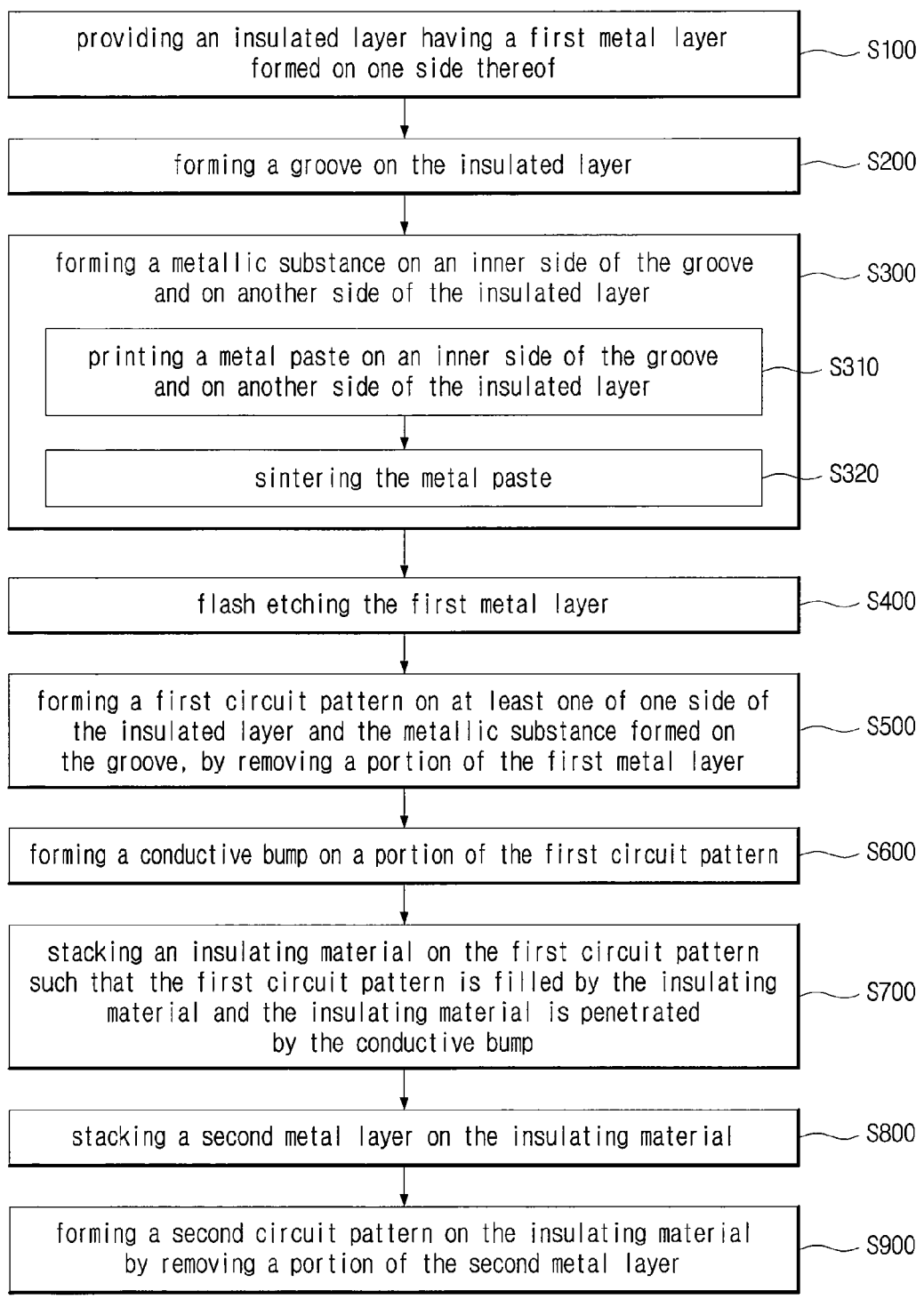
FIG. 1 is a flowchart illustrating a method of manufacturing a printed circuit board in accordance with a first embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various components, such components must not be limited to the above terms. The above terms are used only to distinguish one component from another. The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Embodiments of the present invention will be described below in detail with reference to the accompanying drawings. For better understanding overall in describing aspects of the present invention, the same reference numerals are used for the same means, regardless of the figure number.

A printed circuit board and a method of manufacturing the printed circuit board according to certain embodiments of the present invention will be described below in more detail with reference to the accompanying drawings. Those components that are the same or are in correspondence are rendered the same reference numeral regardless of the figure number, and redundant explanations are omitted.

A method of manufacturing a printed circuit board in accordance with a first embodiment of the present invention will be described below in detail with reference to the accompanying drawings.

FIG. 1 is a flowchart illustrating a method of manufacturing a printed circuit board in accordance with a first embodiment of the present invention. FIGS. 2 to 11 are flowcharts illustrating a process of manufacturing a printed circuit pattern in accordance with a first embodiment of the present invention. Illustrated in FIGS. 2 to 11 are an insulated layer 10, a first metal layer 12, a first circuit pattern 14, a groove 16, a stamp 18, a metallic substance 20, a conductive bump 30, an insulating material 40, a second metal layer 42 and a second circuit pattern 44.

Figure 2:
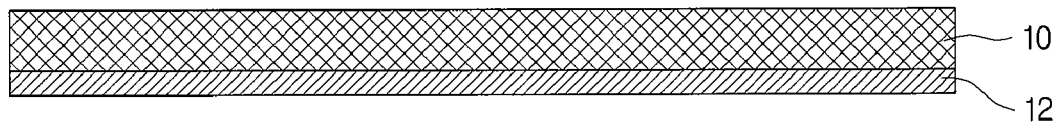
FIG. 2, FIG. 3, FIG. 4, FIG. 5, FIG. 6, FIG. 7, FIG. 8, FIG. 9, FIG. 10, and FIG. 11 are flowcharts illustrating a process of manufacturing a printed circuit pattern in accordance with a first embodiment of the present invention.

A first embodiment of the present invention, as illustrated in FIG. 2, provides an insulated layer 10 that has a first metal layer 12 formed on one side thereof (S100). The first metal layer 12 is made of a conductive metallic substance and can become a circuit pattern by removing a portion of the first metal layer in a process described later. The first metal layer can be formed on one side of the insulated layer 10.

In order to provide the insulated layer 10 with the first metal layer 12 formed on one side thereof, a method of stacking the first metal layer on one side of the insulated layer can be performed. Also, a method of removing a metal layer formed on one side of a metal layered panel having metal layers formed on both sides can be performed.

Figure 3:
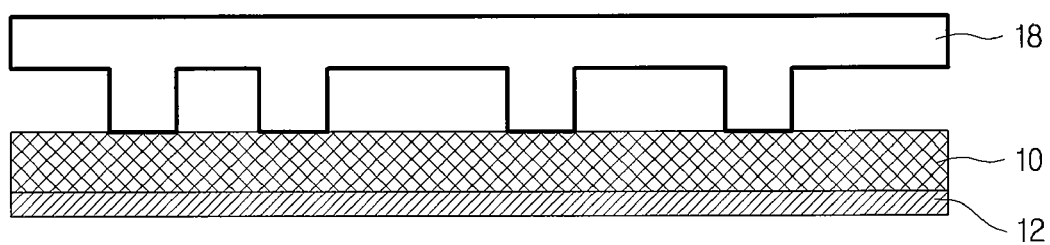
Figure 4:
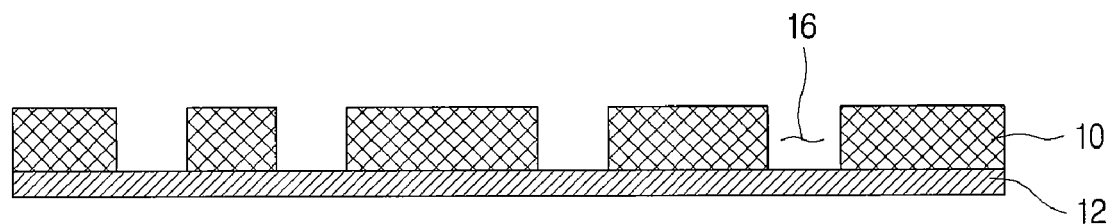

As illustrated in FIGS. 3 and 4, a groove 16 can be formed on the insulated layer 10 (S200). According to a first embodiment of the present invention, the groove 16 can be formed on another side of the insulated layer 10 by way of a imprint process using the stamp 18 as illustrated in FIGS. 3 and 4. The stamp 18 has a bossed pattern illustrated in FIG. 3. The stamp can be pressed against one side of the insulated layer that is a semisolid substance and a nonconductive resin. As illustrated in FIG. 4, the insulated layer 10 can have an depressed carving pattern formed thereon, and then the insulated layer 10 can be dehumidified.

In this embodiment of the present invention, the insulated layer 10 can be penetrated by the groove 16 using the stamp 18. Therefore, the first metal layer 12 formed on one side of the insulated layer 10 can be disposed to the outside through the groove 16.

Figure 5:
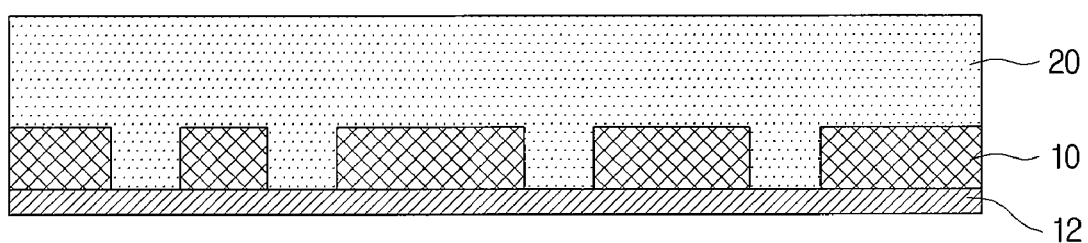

Then, a metallic substance 20 can fill an inner side of the groove 16 and form on another side of the insulated layer 10 as shown in FIG. 5 (S300). Here, the metallic substance 20 is for releasing heat generated from the print circuit board. That is, the metal substance 20 can be disposed in direct contact with the insulated layer 10 such that the heat generated in the print circuit board can be released more efficiently.

In order to form the metallic substance 20 in accordance with the present embodiment, a metallic paste can be printed on an inner side of the groove 16 and on another side of the insulated layer 10 (S310). The metallic paste composing metallic particles will become the metallic substance 20 after hardening. The metallic paste can be printed by way of screen printing. Consequently, the printed metallic paste can fill the groove 16 and form on another side of the insulated layer 10.

And that, the metallic paste filling the groove 16 and forming on another side of the insulated layer 10 can be sintered (S320). A temperature of sintering can be ranged from 400° C. to 500° C. The metallic paste will become the metallic substance 20 after a process of sintering as illustrated in FIG. 5. That is, the metallic substance 20 can be formed on an inside of the groove and another side of the insulated layer by way of screen printing and firing.

According to a first embodiment of the present invention, the metallic substance 20 can be a carbon-nanotube (CNT). The metallic substance 20 for heat release can be formed by way of printing a carbon-nanotube paste on another side of the insulated layer 10 having the groove 16 formed thereon. Here, the carbon-nanotube paste (CNT paste) can be used for both of single wall carbon-nanotube and multi wall carbon-nanotube.

In this embodiment, the metallic substance 20 being made of the most conductive carbon-nanotube thus can have a high efficiency of heat release.

Furthermore, carbon-nanotube (CNT) can be coupled to the first metal layer and the insulated layer 10 by way of sintering in accordance with the present invention, unlike a conventional method of attaching a heat sink by using prepreg, an electrical conductive adhesive and a nonconductive resin.

Figure 6:
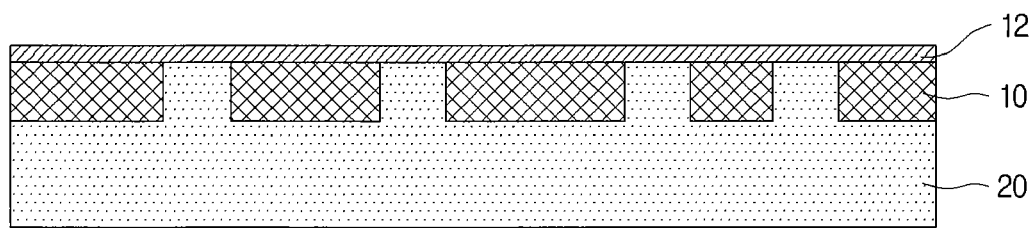

Next, as shown in FIG. 6, the first metal layer 12 is flash etched (S400). the first metal layer 12 is thinly etched after a process of sintering that hardens the metal paste. A temperature of sintering the metal paste can be ranged from 400° C. to 500° C. so that an oxidation development can occur on a surface of the first metal layer. Therefore, the oxidized surface of the first metal layer 12 needs to be removed by way of pickling. That is, a quality of the first metal layer 12 becoming a circuit pattern can be secured by way of flash etching that etches the surface of the first metal layer thinly.

Figure 7:
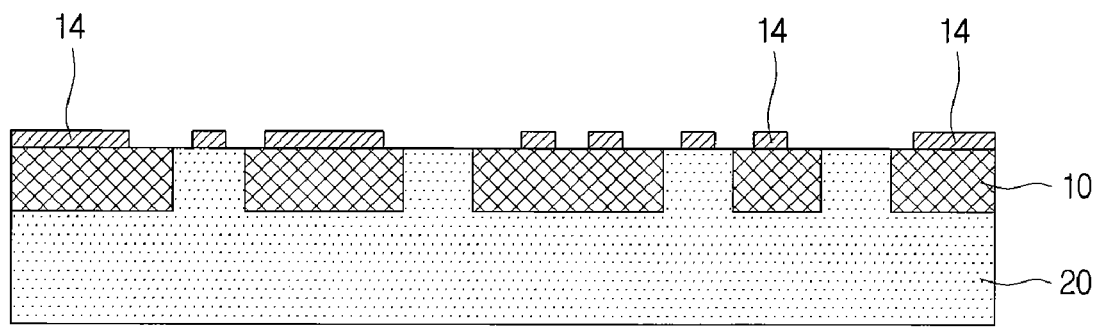

After that, a first circuit pattern 14 is formed as shown in FIG. 7 (S500). The first circuit pattern 14 can be formed by removing a portion of the first metal layer 12. The first circuit pattern can be formed on one side of the insulated layer by removing a portion of the first metal layer formed on one side of the insulated layer 10. As illustrated in FIG. 7, a portion of a ground area can be also formed on the metallic substance 20 formed inside a groove 16 in accordance with the removed portion of the first metal layer 12. According to a first embodiment of the present invention, the first circuit pattern 14 can be formed on at least one of the metallic substance formed inside the groove 16 and one side of the insulated layer 10.

Here, for preventing short circuit, a pad for signal transmission and the first circuit pattern 14 for a line can be formed not to be connected to the metallic substance, i.e. the carbon-nanotube (CNT) according to the present embodiment. Conversely, the ground portion of the first circuit pattern 14, in which there is no danger of short circuit, can be connected to the metallic substance 20 for higher heat release.

As set forth above, the highly heat-conductive metallic substance 20, i.e. the carbon-nanotube (CNT) for a heat sink, can be directly coupled to the insulated layer 10 and the first circuit pattern 14. Therefore, the heat generated from the printed circuit board can be released efficiently.

And then, as illustrated in FIGS. 8 to 11, a multi-layered printed circuit board can be manufactured by a process of stacking.

Figure 8:
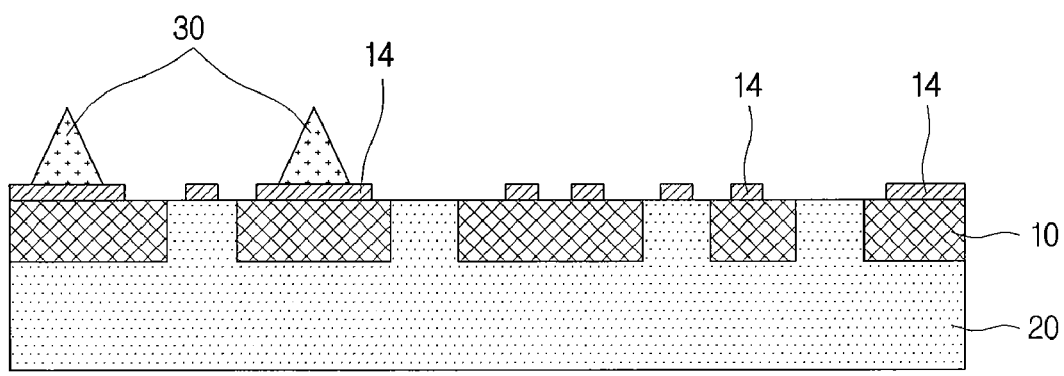
Figure 9:
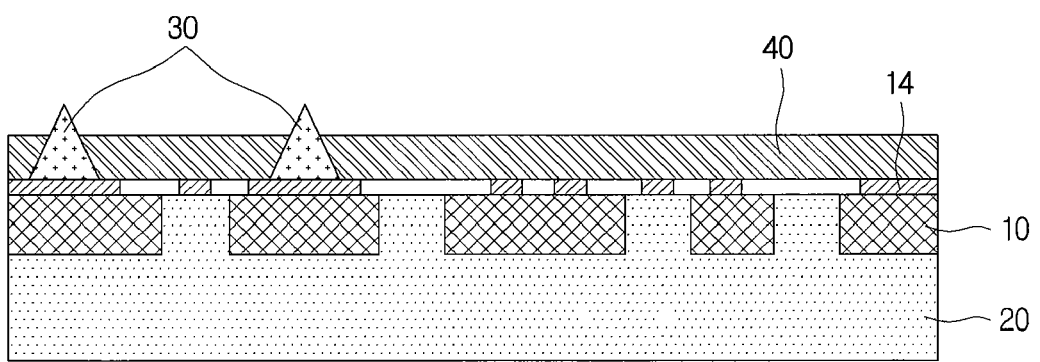

According to a first embodiment of the invention, a conductive bump 30 can be formed on a pad of the first circuit pattern 14 in FIG. 8 (S600). The conductive bump 30 can be formed by way of printing a conductive paste on a portion of the circuit pattern. The conductive bump is for electrical conduction between circuit patterns interposed between insulating materials 40. For that reason, the conductive bump 30 can be made of a highly conductive material such as argentums (Ag) or cuprum (Cu). And then, as illustrated in FIG. 9, the insulating material 40 can be stacked on the first circuit pattern 14 such that the first circuit pattern is surround by the insulating material. The insulating material 40 in a half-hardening state can be penetrated by a conductive bump 30. The insulating material can be stacked on the first circuit pattern 14 such that the conductive bump 30 penetrates the insulating material and exposes to the outside. Here, the insulating material fills up a gap in-between the first circuit patterns 14. That is, a pitch between the first circuit patterns is fills with the insulating material 40 so that the first circuit pattern 14 can be surround with the insulating material 40. The insulating material 40 in a half-hardening state becomes solid after the process of hardening and is for insulating the circuit patterns interposed in-between.

Figure 10:
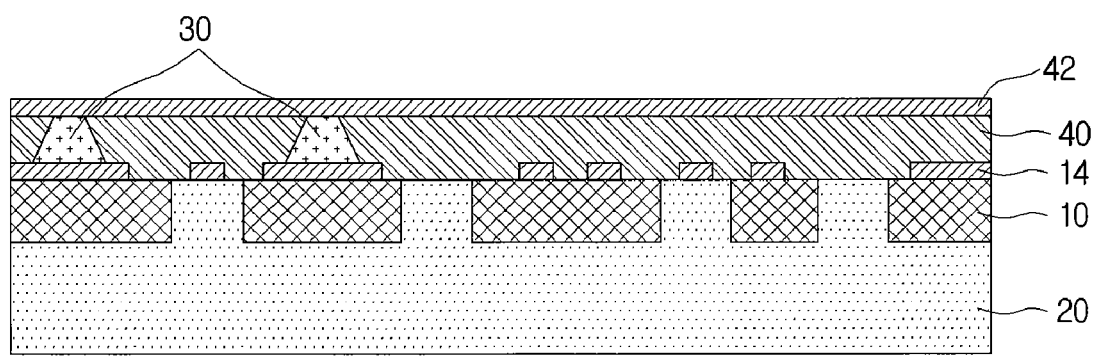

Next, as illustrated in FIG. 10, a second metal layer 42 can be stacked on the insulating material 40 (S800). The second metal layer 42 can be made of a conductive material and become a circuit pattern by removing a portion thereof.

Figure 11:
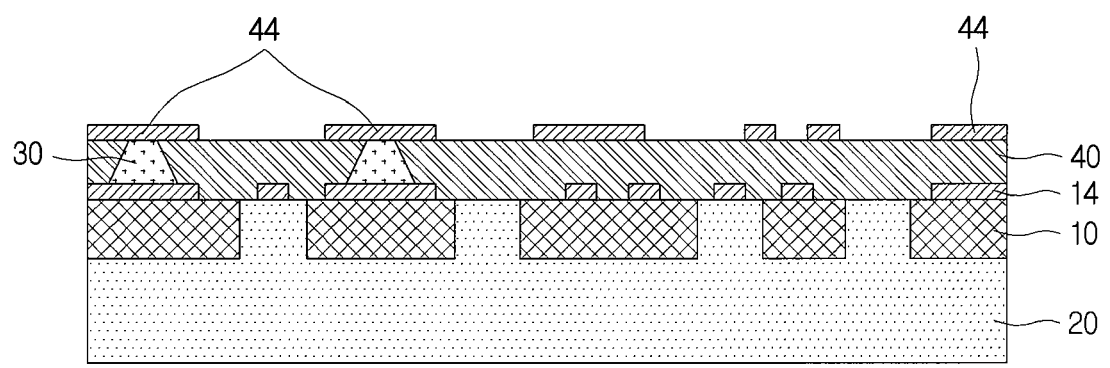

And then, as shown in FIG. 11, a second circuit pattern 44 can be formed on the insulating material 40 by removing a portion of the second metal layer 42 (S900). A portion of the second metal layer 42 can be removed by etching the second metal layer 42 formed on the insulating material 40 selectively. According to the present embodiment of the invention, the second metal layer 42 can be selectively etched by using an etching solution after forming an etching resist on the second metal layer 42. As shown in FIG. 11, the second circuit pattern 44 can be formed on the insulating material 40 by removing a portion of the second metal layer 42.

As illustrated in FIG. 11, the first circuit pattern 14 and the second circuit pattern 44 can be respectively formed on both sides of the insulating material 40. And, the first circuit pattern 14 and the second circuit pattern 44 can be electrically connected through the conductive bump 30. According to a first embodiment of the present invention, a multi-layered printed circuit board having a high efficiency of heat release can be manufactured by coupling the metallic substance 20, i.e. the carbon-nanotube (CNT) for a heat sink, directly to the insulated layer 10 and the first circuit pattern 14.

Figure 12:
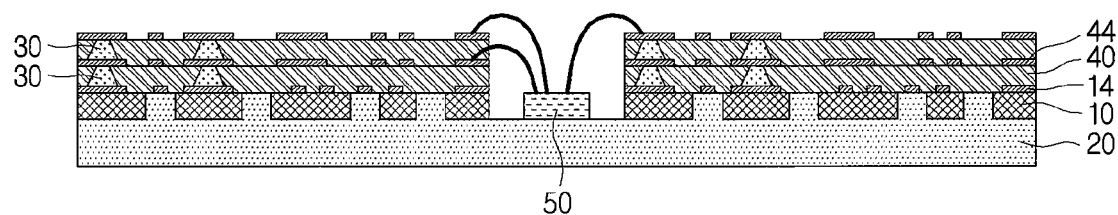
FIG. 12 is a cross-sectional view illustrating a printed circuit board in accordance with a first embodiment of the present invention.
Figure 13:
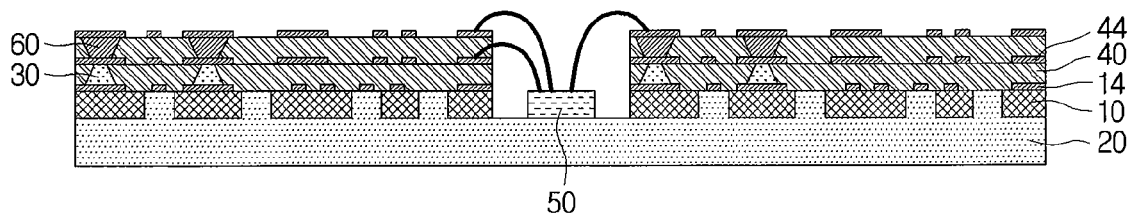
FIG. 13 is a cross-sectional view illustrating a printed circuit board in accordance with a second embodiment of the present invention.
Figure 14:
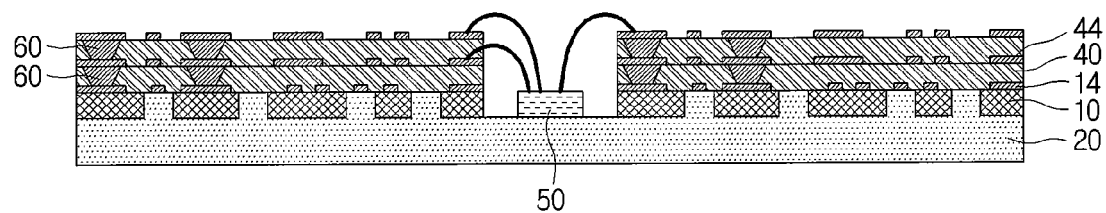
FIG. 14 is a cross-sectional view illustrating a printed circuit board in accordance with a third embodiment of the present invention.

Referring to FIGS. 12 to 14, a printed circuit board will be described in accordance with certain embodiments of the present invention. FIG. 12 is a cross-sectional view of a printed circuit board in accordance with a first embodiment of the present invention, FIG. 13 is a cross-sectional view of a printed circuit board in accordance with a second embodiment of the present invention and FIG. 14 is a cross-sectional view of a printed circuit board in accordance with a third embodiment of the present invention.

As illustrated in FIG. 12, A first embodiment of the present invention provides a printed circuit board comprising an insulated layer 10 having a groove 16 formed therein, a metallic substance 20 forming on an inner side of the groove 16 and one side of the insulated layer 10, and a first circuit pattern 14 forming on at least one of another side of the insulated layer and the metallic substance 20 formed on an inner side of the groove 16.

As set forth above, the insulated layer 10 becomes an insulating material or an insulation board of the printed circuit board, and the metallic substance 20 is directly coupled to the insulated layer 10 or the first circuit pattern 14. Therefore, the metallic substance 20 can efficiently release heat generated from the printed circuit board. In other words, there is no junction layer interposed between the metallic substance 20 and the insulated layer 10 or the first circuit pattern so that heat transfer can occur more efficiently.

Again, the first circuit pattern 14 can be formed on at least one of another side of the insulated layer and the metallic substance 20 formed on an inner side of the groove 16, which is already described above. The ground portion of the first circuit pattern 14, in which there is no danger of short circuit, can be connected to the metallic substance 20 for higher heat release.

And, the metallic substance 20 being made of the most conductive carbon-nanotube thus can have a high efficiency of heat release. A first embodiment of the present invention provides a multi-layered printed circuit board comprising a conductive bump 30 formed on a portion of the first circuit pattern 14, an insulating material 40 stacked on the first circuit pattern 14 such that the first circuit pattern 14 is surround with the insulating material, and a second circuit pattern 44 formed on the insulating material. Likewise, a multi-layered circuit pattern can be formed by the method mentioned above. Here, the first circuit pattern 14 and the second circuit pattern 44 can be electrically connected by the conductive bump 30.

The printed circuit board in accordance with the present embodiment has the metallic substance 20, i.e. carbon-nanotube (CNT) as a heat sink, directly coupled to one side of the printed circuit board. That is, there is no junction layer interposed between the carbon-nanotube heat sink and the printed circuit board. Therefore, the carbon-nanotube heat sink can release heat generated in the printed circuit board or an electronic terminal 50 more efficiently to outside.

Next, according to a second embodiment of the present invention, each of multi-layered circuit patterns can be electrically connected by a conductive bump 30 and a via 60 in FIG. 13. That is, a first circuit pattern 14 and a second circuit pattern 44 are connected by the conductive bump 30 and the second circuit pattern 44 and a circuit pattern formed above it are connected by the via 60 as illustrated in FIG. 13.

Meanwhile, according to a third embodiment of the present invention, multi-layered circuit patterns are electrically connected by a via 60.

That is, in other words, methods of electrically connecting the multi-layered circuit patterns can be varied by an intention of design and way of manufacturing.

The embodiments of the present invention as set forth above can provide the printed circuit board having a high efficiency of heat emission by disposing a heat sink in direct contact with a board and the method of manufacturing the printed circuit board.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention. As such, many embodiments other than those set forth above can be found in the appended claims.

What is claimed is:

1. A method of manufacturing a printed circuit board, the method comprising:
    providing an insulated layer, a first metal layer being formed on one side of the insulated layer;
    forming a groove on the insulated layer;
    forming a metallic substance on an inner side of the groove filling therein and on another side of the insulated layer; and
    forming a first circuit pattern on at least one of one side of the insulated layer and the metallic substance formed on the groove, by removing a portion of the first metal layer.

2. The method of claim 1, wherein the groove is formed on the insulated layer by way of a imprint process.

3. The method of claim 1, wherein the forming of the metallic substance comprises:
    printing a metal paste on an inner side of the groove and another side of the insulated layer; and
    sintering the metal paste.

4. The method of claim 1, further comprising, prior to the forming of the first circuit pattern, flash etching the first metal layer.

5. The method of claim 1, wherein the metallic substance is carbon-nanotube.

6. The method of claim 1, further comprising:
    forming a conductive bump on a portion of the first circuit pattern;
    stacking an insulating material on the first circuit pattern such that the first circuit pattern is filled by the insulating material and the insulating material is penetrated by the conductive bump;
    stacking a second metal layer on the insulating material; and
    forming a second circuit pattern on the insulating material by removing a portion of the second metal layer.

* * * * *